US012262563B2

(12) United States Patent
Sun et al.

(10) Patent No.: US 12,262,563 B2
(45) Date of Patent: Mar. 25, 2025

(54) PIXEL CELL HAVING ANTI-BLOOMING STRUCTURE AND IMAGE SENSOR

(71) Applicant: Omnivision Technologies, Inc., Santa Clara, CA (US)

(72) Inventors: Shiyu Sun, Cupertino, CA (US); Yuanwei Zheng, San Jose, CA (US); Gang Chen, San Jose, CA (US); Sing-Chung Hu, San Jose, CA (US); Armin Yazdani, New York, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 21 days.

(21) Appl. No.: 17/701,632

(22) Filed: Mar. 22, 2022

(65) Prior Publication Data
US 2023/0307484 A1 Sep. 28, 2023

(51) Int. Cl.
H10F 39/18 (2025.01)

(52) U.S. Cl.
CPC .............................. H10F 39/1865 (2025.01)

(58) Field of Classification Search
CPC .............................................. H01L 27/14656
USPC ......................................................... 257/230
See application file for complete search history.

(56) References Cited

U.S. PATENT DOCUMENTS

| 10,741,539 | B2* | 8/2020 | Chen ..................... G06F 30/394 |
| 2004/0262609 | A1* | 12/2004 | Mouli ............... H01L 27/14603 |
| | | | 257/E27.132 |
| 2006/0084195 | A1* | 4/2006 | Lyu ..................... H01L 27/14603 |
| | | | 257/E27.131 |
| 2011/0089311 | A1* | 4/2011 | Venezia ............. H01L 27/14689 |
| | | | 257/E31.073 |
| 2011/0108897 | A1* | 5/2011 | Koo ..................... H01L 27/1463 |
| | | | 257/292 |
| 2012/0242875 | A1* | 9/2012 | Nakamura .......... H01L 27/1461 |
| | | | 438/57 |
| 2013/0248937 | A1* | 9/2013 | Nozaki ............. H01L 27/14616 |
| | | | 257/225 |
| 2016/0043132 | A1* | 2/2016 | Ihara ................... H01L 27/1463 |
| | | | 257/291 |
| 2016/0286151 | A1* | 9/2016 | Lahav ............... H01L 27/14643 |
| 2017/0018584 | A1* | 1/2017 | Ma ..................... H01L 27/14643 |
| 2018/0190708 | A1* | 7/2018 | Lee ......................... H10F 39/811 |
| 2019/0131326 | A1* | 5/2019 | Kim ..................... H01L 27/1461 |
| 2020/0119082 | A1* | 4/2020 | Lee ..................... H01L 27/1463 |
| 2020/0411585 | A1* | 12/2020 | Huang .............. H01L 27/14614 |

* cited by examiner

Primary Examiner — Sheng-Bai Zhu

(57) ABSTRACT

A pixel cell is formed on a semiconductor substrate having a front surface. The pixel cell includes a photodiode, a floating diffusion region, and a transfer gate. The photodiode is disposed in the semiconductor substrate. The floating diffusion region includes a first doped region disposed in the semiconductor substrate, wherein the first doped region extends from the front surface to a first junction depth in the semiconductor substrate. The transfer gate is configured to selectively couple the photodiode to the floating diffusion region controlling charge transfer between the photodiode and the floating diffusion region. The transfer gate includes a planar gate disposed on the front surface of the semiconductor substrate and a pair of vertical gate electrodes. Each vertical gate electrode extending a gate depth from the planar gate into the semiconductor substrate. The first junction depth is greater than the gate depth.

19 Claims, 6 Drawing Sheets

PIXEL CELL HAVING ANTI-BLOOMING STRUCTURE AND IMAGE SENSOR

TECHNICAL FIELD

This disclosure relates generally to Complementary Metal-Oxide-Semiconductor (CMOS) image sensors, and in particular but not exclusively, relates to an anti-blooming structure for a pixel cell and an image sensor.

BACKGROUND INFORMATION

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical complementary metal oxide semiconductor (CMOS) image sensor operates in response to image light from an external scene being incident upon the image sensor. The image sensor includes an array of pixel circuits having photosensitive elements (e.g., photodiodes) that absorb a portion of the incident image light and generate image charge upon absorption of the image light. The image charge photo-generated by the photosensitive elements may be transferred to a floating diffusion within the pixel circuits. The image charge transferred to the floating diffusion may be read out from the pixel circuits through analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
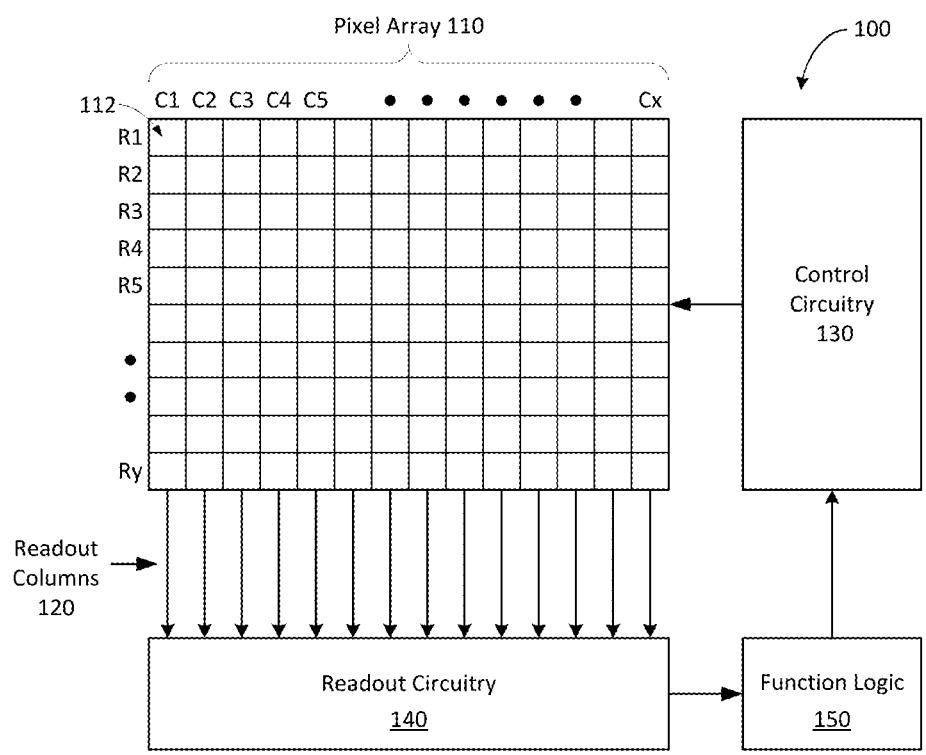
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In some imaging scenarios, blooming artifacts degrade the quality of images captured by image sensors that include vertical gates. Blooming is a type of electrical crosstalk that occurs when, in response to light incident on a pixel, the quantity of photoelectrons accumulated in a pixel's photodiode exceeds the pixel's saturation level (full well capacity), for example under a very bright light condition, such that excess photoelectrons are detected by one or more adjacent pixels. Embodiments disclosed herein remedy this problem by increasing a junction depth of floating diffusion region to introduce a buried anti-blooming path between a photodiode and associated floating diffusion region, which provides a leakage path that enables excess photoelectrons generated in a photodiode of a pixel cell, to overflow from the photodiode to the pixel cell's floating diffusion region during integration (or exposure) period where the photodiode's associated transfer gate is turned off (e.g., negative biased). The excess photoelectrons is thus detected and do not result as blooming artifacts.

Embodiments of a pixel cell structure for an imaging sensor to improve blooming are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. The appearances of the phrases "in one example" or "in one embodiment" in various places throughout this specification are not necessarily all referring to the same example. Furthermore, the particular features, structures, or characteristics may be combined in any suitable manner in one or more examples.

Specific examples of components and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

It will be further understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another region, layer or section and not to limit or set the order. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (for example, rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

It will be understood that when an element or layer is preferred to as being "formed on," another element or layer, it can be directly or indirectly formed on the other element or layer. That is, for example, intervening elements or layers may be present. In contrast, when an element or layer is referred to as being "directly formed on," to another element, there are no intervening elements or layers present. Other words used to describe the relationship between elements or layers should be interpreted in a like fashion (e.g., "between," versus "directly between," "adjacent," versus "directly adjacent," etc.).

It is appreciated that the term "photodiode region" may correspond to a region within the semiconductor substrate that has been doped, for example by ion implantation, to have an opposite charge carrier type (i.e., conductivity type) relative to the majority charge carrier type of the semiconductor substrate such that an outer perimeter of the doped region (e.g., herein referred to as a photodiode region) forms a PN junction or a PIN junction of a photodiode. For example, an N-doped region, formed in a P-type semiconductor substrate, forms a corresponding photodiode region. In some embodiments, a given pixel may further include a pinning region (e.g., a doped region disposed between a side of the semiconductor substrate and the photodiode region having a conductivity type opposite of the photodiode region conductivity type) to form a pinned photodiode. For example, the pinning region has a P-type conductivity and the photodiode region has an N-type conductivity.

Throughout this specification, several terms of art are used. These terms are to take on their ordinary meaning in the art from which they come, unless specifically defined herein or the context of their use would clearly suggest otherwise.

FIG. 1 illustrates an example block diagram of an imaging system 10 including an image sensor 100, in accordance with the teachings of the present disclosure. Image sensor 100 of the imaging system 10 is one possible implementation of the image sensor having at least a pixel cell illustrated in FIGS. 2A-2I, FIG. 3, FIGS. 4A-4D, and FIG. 5. Imaging sensor 100 includes pixel array 110, control circuitry 130, readout circuitry 140, and function logic 150. In one embodiment, pixel array 110 is a two-dimensional (2D) array of photodiodes or image sensor pixels (e.g. pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render an image or video of the person, place, object, etc. However, photodiodes do not have to be arranged into rows and columns and may take other configurations.

In one embodiment, after each image sensor photodiode/pixel in pixel array 110 has acquired its image data or image charge, the image data is readout by readout circuitry 140 and then transferred to function logic 150. In various examples, readout circuitry 140 may include amplification circuitry, analog-to-digital (ADC) conversion circuitry, or otherwise. Function logic 150 may simply store the image data or even manipulate the image data by applying post image effects (e.g., autofocus, crop, rotate, remove red eye, adjust brightness, adjust contrast, or otherwise). In the same or another embodiment, readout circuitry 140 may readout a row of image data at a time along readout column lines 120 or may readout the image data using a variety of other techniques (not illustrated), such as a serial readout or a full parallel readout of all pixels simultaneously. In one embodiment, control circuitry 130 is coupled to pixel array 110 to control operation of the plurality of photodiodes or image sensor pixels in pixel array 110. For example, control circuitry 130 may generate a shutter signal for controlling image acquisition. In some embodiments, control circuitry 130 transmits signals to control operations of the plurality of photodiodes in pixel array 110 through a plurality of contact pads in a bonding pad (BPAD) region surrounding the pixel array 110.

It is appreciated that imaging system 10 may be included in a digital camera, cell phone, laptop computer, surveillance camera, automobile camera, endoscope, or the like. Imaging system 10 may be coupled to other pieces of hardware such as a processor (general purpose or otherwise), memory elements, output (USB port, wireless transmitter, HDMI port, etc.), lighting/flash, electrical input (keyboard, touch display, trackpad, mouse, microphone, etc.), and/or display. Other pieces of hardware may deliver instructions to imaging system 10, extract image data from imaging system 10, or manipulate image data supplied by imaging system 10.

It is further appreciated that while the block diagram illustrated in FIG. 1 shows pixel array 110, readout circuitry 140, function logic 150, and control circuitry 130 as distinct and separate elements from the pixel array, this is not necessarily the case as such features may be combined or otherwise incorporated with the pixel array directly (e.g., within and/or between individual pixels, in the form of stacked substrates, or otherwise). For example, the readout circuitry 140 may include one or more transistors (e.g., associated with 3T, 4T, 5T, or other pixel architectures for reading out image charge from individual pixels), elements of which may be disposed between segments of individual photodiodes in accordance with embodiments of the present disclosure.

In some embodiments, pixel array 110, readout circuitry 140, function logic 150, and control circuitry 130 may be all formed on a single wafer (e.g., on the same die). For example, pixel array 110 and readout circuitry 140 are formed in an active region of a wafer, function logic 150 and control circuitry 130 are formed in a peripheral region of the wafer surrounding the active region.

In some embodiments, pixel array 110, readout circuitry 140, function logic 150, and control circuitry 130 may be formed on separate wafers and bonded together via oxide bonding or hybrid bonding forming stacking die structure. For example, pixel array 110 is formed on a first wafer, while readout circuitry 140, function logic 150 and control circuitry 130 are formed on a second wafer, where the first and second wafers are bonded together, for example by Cu—Cu bonding, oxide to oxide boning or hybrid bonding, forming two-layer stacking structure. For another example, pixel array 110 is formed on a first wafer, readout circuitry 140 is formed on a second wafer, and function logic 150 and control circuitry 130 are formed on a third wafer, where the first, second and third wafers are bonded together for example by Cu—Cu bonding, oxide to oxide boning or hybrid bonding, forming three-layer stacking structure.

Furthermore, the image sensor 100 may include features not explicitly illustrated or discussed but known by one of ordinary skill in the art such as array of color filters, array of microlenses, a metal grid, and the like. Additionally, it is appreciated that image sensor 100 is fabricable by conventional CMOS manufacturing techniques known by one of ordinary skill in the art, which may include, but is not limited to, photolithography, chemical vapor deposition, physical vapor deposition, ion implantation or diffusion, thermal oxidation, reactive ion etching, wet chemical etching, chemical mechanical polishing, and the like.

The processes explained above may be implemented using software and/or hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g. a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

Figure 2A:
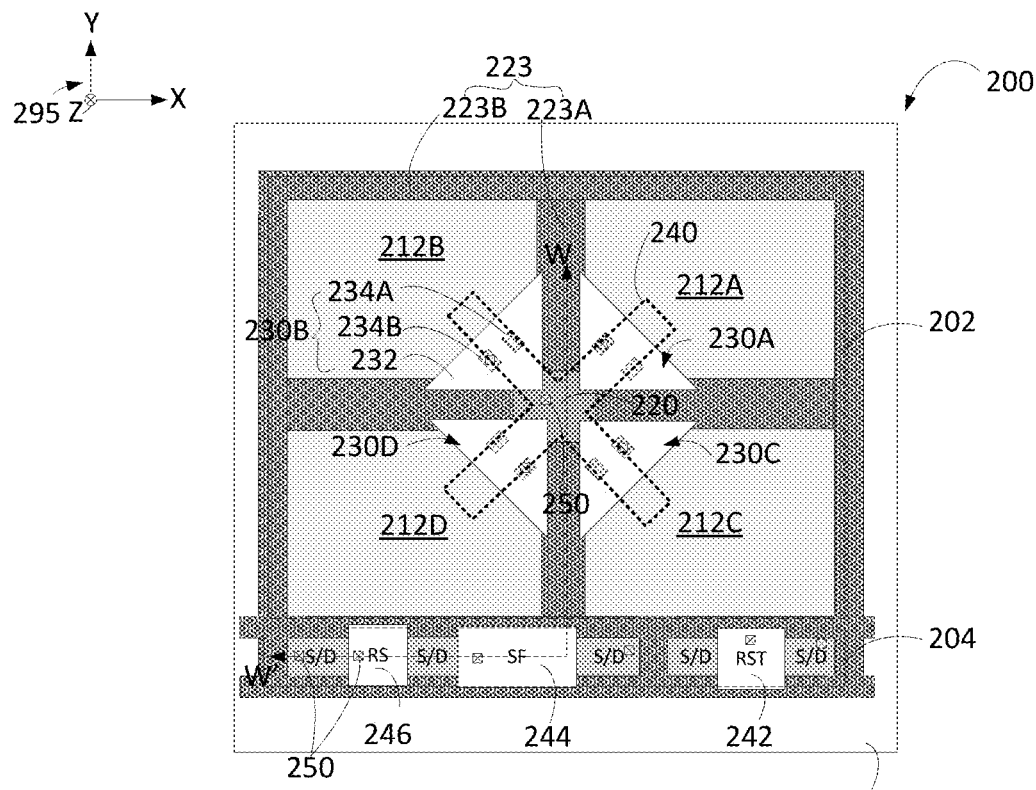
FIGS. 2A-2B respectively illustrate a front side and a backside view of an example shared pixel layout including four photodiodes sharing a common floating diffusion region, in accordance with the teachings of the present disclosure.

FIG. 2A illustrates a plan view of one example pixel cell 200 having vertical gate structures in accordance with the teachings of the present invention for an image sensor. In various examples, pixel cell 200 is one of a plurality of pixel cells arranged in a pixel array of an image sensor. Pixel cell 200 is formed on a semiconductor substrate 210 (e.g., silicon, a silicon germanium alloy, germanium, a silicon carbide alloy, an indium gallium arsenide alloy, any other alloys formed of III-V compounds, other semiconductor materials or alloys, combinations thereof, a substrate thereof, a doped substrate thereof, a bulk substrate thereof, or a wafer thereof) having a front side surface (or front surface) and a backside surface (or back surface) opposite to the front side surface. Pixel cell 200 may include a plurality of photodiodes including photodiode 212A, photodiode 212B, photodiode 212C, and photodiode 212D, a plurality of transfer gates including a transfer gate 230A, a transfer gate 230B, a transfer gate 230C, and a transfer gate 230D, a floating diffusion region 220, an isolation well region 223, a deep trench isolation structure 227, and a plurality of pixel transistors at least including a reset transistor 242, a source follower transistor 244, and a row-select transistor 246.

The plurality of photodiodes, e.g., photodiode 212A, photodiode 212B, photodiode 212C, and photodiode 212D, is disposed in the semiconductor substrate 210. Each of photodiode 212A, photodiode 212B, photodiode 212C, and photodiode 212D may be buried beneath the front side surface of the semiconductor substrate 210. It is noted that in the depicted example, pixel cell 200 includes four photodiodes 212A, 212B, 212C, 212D. However, it is appreciated that in other examples, pixel cell 200 may include a more or less number of photodiodes. For instance, in another example, pixel cell 200 may include eight photodiodes, while in another example, pixel cell 200 may include one photodiode. In another example, pixel cell 200 may include nine photodiodes, while in another example, pixel cell 200 may include two photodiodes.

Each of photodiode 212A, photodiode 212B, photodiode 212C, and photodiode 212D may include a photodiode region (or charge collection region) in the semiconductor substrate 210 for accumulating photo-generated image charges (e.g., electrons or holes) in response to incident light received during an integration or exposure period of the image sensor. The photodiode region may be formed of one or more doped regions, by one or more implantation. The photodiode region has a conductive type opposite to that of the semiconductor substrate 210. For example, the photodiode region is of N-type doped region and the semiconductor substrate 210 is of a P-type doped substrate. For another example, the photodiode region is of P-type doped region and the semiconductor substrate 210 is of an N-type doped substrate.

Each of transfer gate 230A, transfer gate 230B, transfer gate 230C, and transfer gate 230D is disposed proximate to the front side surface of the semiconductor substrate 210. Each of transfer gates 230A, 230B, 230C, and 230C may be disposed between respective photodiodes 212A, 212B, 212C. 212D and the floating diffusion region 220. Each of transfer gates 230A, 230B, 230C, and 230C couples a respective one of the plurality of photodiodes 212A, 212B, 212C. 212D to the floating diffusion region 220 for controlling charge flow between the plurality of photodiodes 212A, 212B, 212C. 212D and the floating diffusion region 220. Each of the plurality of the transfer gates 230A, 230B, 230C, and 230D is coupled to transfer image charge that is photo-generated in respective photodiode region of each photodiode 212A, 212B, 212C, or 212D toward the front side surface of the semiconductor material 210 and into the shared floating diffusion region 220 in response to a respective transfer control signal.

Each of transfer gates 230A, 230B, 230C, and 230D includes a planar gate electrode disposed on the front side surface of the semiconductor substrate 210 and a pair of vertical gate electrodes extending a gate depth into the semiconductor substrate 210, with respect to front side surface, from the corresponding planar gate electrode towards the respective underlying buried photodiode 212A, 212B, 212C, or 212D. Taking transfer gate 230B as an example for illustration, the transfer gate 230B has a planar gate electrode 232 and a pair of vertical gate electrodes including a first vertical gate electrode 234A and a second vertical gate electrode 234B. The planar gate electrode 232 is disposed on the front side surface of the semiconductor material 210. Each of the first vertical gate electrode 234A and a second vertical gate electrode 234B extends from the planar gate electrode 232 into the semiconductor substrate 210 toward photodiode 212B (e.g., toward the photodiode region of the photodiode 212B). The first vertical gate electrode 234A and the second vertical gate electrode 234B may be arranged in parallel and laterally spaced from each other.

The floating diffusion region 220 is disposed in the semiconductor substrate 210 proximate to the plurality of transfer gates 230A, 230B, 230C, and 230D. Each of the plurality of transfer gates 230A, 230B, 230C, and 230D may be arranged in between each of respective photodiodes 212A, 212B, 212C, and 212D and floating diffusion region 220. In the example, the floating diffusion region 220 is shared among the plurality of photodiodes 212A, 212B, 212C, and 212D. The floating diffusion region 220 is configured to store charges transferred from each of the plurality of photodiodes 212A, 212B, 212C, 212D through respective transfer gates 230A, 230B, 230C, and 230D. The floating diffusion region 220 is of the same conductive type as the photodiode regions of the plurality of photodiodes 212A, 212B, 212C, 212D.

The floating diffusion region 220 is further coupled to a source of the reset transistor 242 and a source follower gate SF of the source follower transistor 244 through respective metal contact 250 and one or more metal interconnects in one or more metallization layers (not illustrated). The source follower transistor 244 is coupled to modulate an image signal based on the voltage of the floating diffusion region 220. The image signal corresponds to the amount of photo-generated image charges accumulated in each respective photodiodes 212A-212D during an integration period, transferred to floating diffusion region 220 during a charge transfer period, and outputted by the floating diffusion region 220 to the source follower gate SF. The row-select transistor 246 selectively couples the output (e.g., the image signal) of source follower transistor 244 to the column bitline (e.g., readout column line 120 of FIG. 1) through corresponding metal contact 250 and one or more metal interconnect in the one or more metallization layers under control of a row-select signal RS_SIG. It is further appreciated that the illustrated pixel circuitry architecture is just one example and that other pixel control architecture known in the art may also be utilized. For example, a drain of reset transistor 242 and a drain of source follower transistor 244 can be formed of a common doped region that is shared by reset transistor 242 and source follower transistor 244 to reduce amount of space needed for pixel transistors.

The isolation well region 223 includes an inner isolation well region 223A (or a first isolation well region) and an outer isolation well region 223B (or a second isolation well region). The inner isolation well region 223A is disposed in the semiconductor substrate 210 between adjacent photodiodes within pixel cell 200 region providing electrical isolation between adjacent photodiodes. The inner isolation well region 223A provides intra photodiode isolation within the pixel cell 200. For example, the inner isolation well region 223A is disposed between photodiode 212A and adjacent photodiodes electrically isolated the photodiode region of photodiode 212A from photodiode regions of adjacent photodiodes 212B, 212C, and 212D.

The outer isolation well region 223B may be disposed around an outer perimeter of the pixel cell 200 providing electrical isolation between photodiodes 212A-212D of pixel cell 200 and photodiodes of adjacent pixel cells 200. The outer isolation well region 223B may surround the plurality of photodiodes 212A-212D, and further provide electrical isolation between photodiodes and pixel transistors. For example, the outer isolation well region 223B separates photodiode 212C and photodiode 212D and pixel transistors associated with the pixel cell 200 such as the source follower transistor 244, reset transistor 246, and the row-select transistor 242.

In embodiments, the inner isolation well region 223A and the outer isolation well region 223B of the isolation well 223, each may be formed of doped well region having a conductive type opposite to the conductive type of floating diffusion region 220 and photodiode regions included in each of the plurality of photodiodes 212A-212D. For example, each of the inner isolation well region 223A and the outer isolation well region 223B is of P-type (such as boron-doped region) i.e., P-type well region, while the floating diffusion region 220 and the photodiode regions of the plurality of photodiodes are of N-type doped regions (such as phosphorus and/or arsenic doped region). Each of the inner isolation well region 223A and the outer isolation well region 223B may be of same conductive type as the semiconductor substrate 210 and each has a concentration higher than a concentration of the semiconductor substrate 210.

In embodiments, the outer isolation well region 223B may in a grid form across the pixel array of the image sensor providing isolation between adjacent pixel cells. In one embodiment, the inner isolation well region 223A and the outer isolation well region 223B are electrically connected. The inner isolation well region 223A and the outer isolation well region 223B may be coupled to a ground through corresponding metal contacts and one or more metal interconnects in one or more metallization layers.

In embodiments, the substrate region of pixel cell 200 containing the plurality of photodiodes 212A-2121) can be refer as an active region 202 of pixel cell 200, and the substrate region of pixel cell 200 containing pixel transistors such as reset transistor 242, source follower transistor 244, and row-select transistor 246 can be refer as a transistor region 204 of pixel 200. The transistor region 204 may be arranged on one side of the active region 202, for example on a bottom side with respect to the illustrated coordinate system 295. The pixel transistors in the transistor region 204 may be laterally placed along an x-direction of a coordinate system 295. It is appreciated that the arrangement and the orientation of transistor region 204 to the active region 202 may be depend on pixel layout needs, for example the transistor region 204 may be arranged on top, left or right side with respective to the active region 202 with pixel transistors placed along the y-direction coordinate system 295. Similarly, multiple transistor regions 204 may be arranged along different sides of the active region 202. The active region 202 is separated from the transistor region 204 by the outer isolation well region 223B.

The pixel cell 200 may include a buried channel implant region 240 that is disposed in the semiconductor substrate 210 beneath the front side surface of the semiconductor substrate 210, and proximate to the corresponding photodiode region of each photodiode 212A, 212B, 212C or 212D. The buried channel implant region 240 is disposed in between first and second vertical gate electrodes 234A, 234B of each respective transfer gate 230A-230D to facilitate coupling between each of the photodiodes 212A, 212B, 212C and 212D and the floating diffusion region 220. The buried channel implant region 240 is implanted in a such manner that it forms a buried channel region in a substrate region of the semiconductor substrate 210 between the first and second vertical gate electrodes 234A. 234B of each corresponding transfer gate 230A-230B, and the formed buried channel region extends from the floating diffusion region 220 toward photodiode regions of each individual photodiode 212A, 212B, 212C or 212D along a channel direction of each respective transfer gate 230A-230D enabling a first anti-blooming or overflow path between each of the photodiodes 212A, 212B, 212C and 212D and the floating diffusion region 220. As such, when the plurality of transfer gates 230A-230D are turned off (e.g., negatively biased) during the integration period, excess photo-generated charges from each of photodiode 212A, 212B, 212C or 212D can overflow to the floating diffusion region 220 through the first anti-blooming path instead to adjacent photodiodes, thereby reduce blooming associated with pixel cell 200.

In embodiments, as will be described later, the floating diffusion region 220 may include multiple doped regions with the deepest junction depth being greater than a gate depth of each individual vertical gate electrodes of the transfer gate (i.e., greater than the gate depth of either the first vertical gate electrode 234A or the second vertical gate electrode 234B) providing a second anti-blooming path proximate between photodiode regions of the plurality of photodiodes 212A, 212B, 212C, 212D and floating diffusion region 220 for excess photo-generated charges to overflow from each individual photodiode 212A, 212B, 212C, or 212D to the floating diffusion region 220, further improves blooming.

Figure 2B:
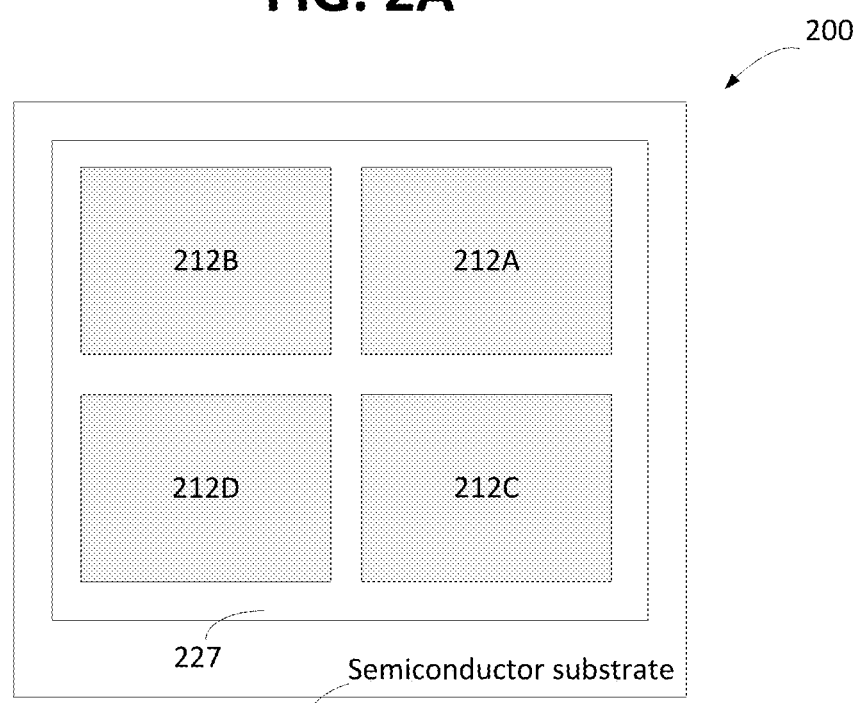

FIG. 2B illustrates another plan view of one example pixel cell 200 in accordance with the teachings of the present invention for an image sensor. FIG. 2A illustrate the plan view of example pixel cell 200 from the front side surface of the semiconductor substrate 210 and FIG. 2B may illustrate the plan view of example pixel cell 200 from the backside surface of the semiconductor substrate 210.

The deep trench isolation structure 227 extends from the backside surface of the semiconductor substrate 210 toward the front side surface of the semiconductor substrate 210. The deep trench isolation structure 227 may be arranged in a trench-grid form and disposed between adjacent photodiodes 212A-212D and between adjacent pixel cells providing electrical and/or optical isolation between adjacent photodiodes 212A-212D within pixel cell 200 and between photodiode of adjacent pixel cells. The deep trench isolation structure 227 extends from the backside surface of the semiconductor substrate 210 a depth into the semiconductor substrate 210. The depth that deep trench isolation structure 227 extends into the semiconductor substrate 210 may be less than or equal to a thickness of the semiconductor substrate 210.

The deep trench isolation structure 227 may further extend into the first isolation well region 223A and the second isolation well region 223B, respectively. The deep trench isolation structure 227 may be at least in part surrounded by the first isolation well region 223A and the second isolation well region 223B, respectively. The deep trench isolation structure 227 may be an oxide filled (e.g., $SiO_2$) or a metal filled (e.g., aluminum or tungsten) isolation structures disposed within the semiconductor substrate 210. The deep trench isolation structure 227 may also be a combination of oxide filled and metal filled isolation structures disposed within the semiconductor substrate 210.

Figure 3:
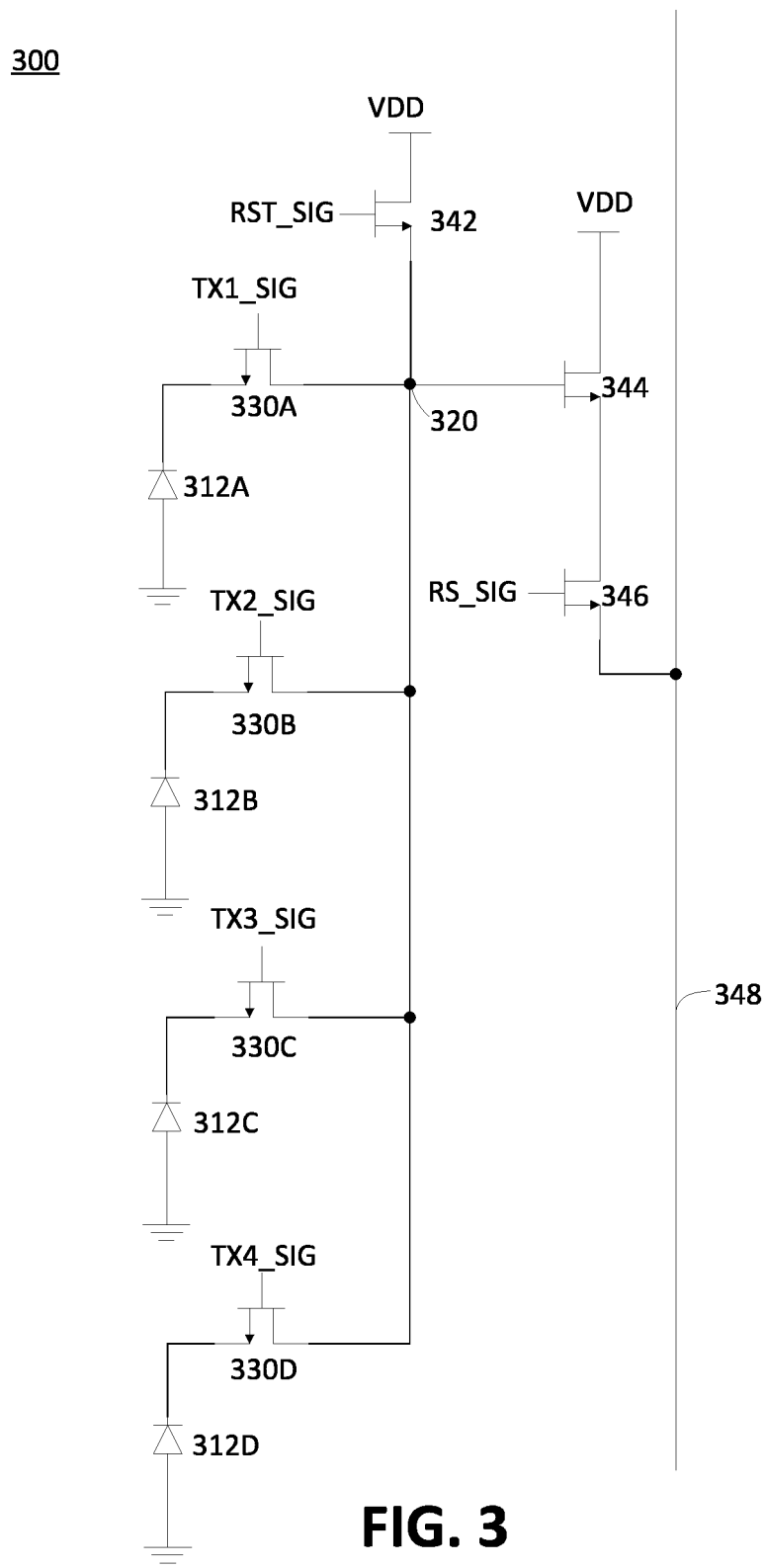
FIG. 3 depicts an example pixel circuit associated with a pixel cell of FIG. 2A, in accordance with the teachings of the present disclosure.

FIG. 3 depicts a circuit diagram of a four-transistor ("4T") circuitry, which is a candidate pixel circuitry architecture of pixel cell 200. Pixel circuitry 300 includes a plurality of photodiodes 312A~312D, a plurality of transfer transistors 330A~330D, a floating diffusion region 320, a reset transistor 342, a source follower transistor 344, and a row-select transistor 346.

Each of the plurality of transfer transistors 330A~330D selectively couple each respectively photodiodes 312A~312D to the floating diffusion region 320 in response to corresponding transfer control signals TX1_SIG~TX4_SIG received at respective gate of the plurality of transfer transistors 330A~330D. In embodiments, photodiode 312A and floating diffusion region 320 are a source and a drain, respectively, of transfer transistor 330A, photodiode 312B and floating diffusion region 320 are a source and a drain, respectively, of transfer transistor 330B, photodiode 312C and floating diffusion region 320 are a source and a drain, respectively, of transfer transistor 330C, and photodiode 312D and floating diffusion region 320 are a source and a drain, respectively, of transfer transistor 330D. The floating diffusion region 320 is shared among the plurality of photodiode 312A~312D.

Each of photodiodes 312A~312D is at least partially buried in a semiconductor substrate (e.g., semiconductor substrate 210) and is configured to generate and accumulate photo-generated image charges in response to incident light (illumination) thereon, for example entered from an illuminated surface of semiconductor substrate 210 (e.g., backside surface of semiconductor substrate 210) during an integration period of an image sensor.

More specifically, electrical connection of each photodiodes 312A, 312B, 312C, or 312D to floating diffusion region 320 depends on voltage applied to a transfer gate (e.g., transfer gate 230A~230D of FIG. 2A) of the respective transfer transistor (e.g., transfer transistors 330A~330D). Charges, e.g., photo-generated electrons or holes, accumulated in the photodiode region of individual photodiode 312A, 312B, 312C, or 312D can be selectively transferred to floating diffusion region 320 depending on voltage applied to the corresponding transfer gate of the respective transfer transistor (e.g., transfer transistors 330A~330D), for example during a charge transfer period after the integration period. Each of the plurality of photodiodes 312A~312D may be in form of various configurations including pinned photodiode configuration, partially pinned photodiode configuration.

A transfer gate (e.g., transfer gate 230A~230D of FIG. 2A) of each transfer transistor 330A~330D may have a vertical gate portion formed of one or more vertical gate electrodes (e.g., a first vertical gate electrode 234A and a second vertical gate electrode 234B) formed in respective trenches defined by a substrate surface (e.g., the front side surface of the semiconductor substrate 210).

The reset transistor 342, a source follower transistor 344, and a row-select transistor 346 are shared among the plurality of photodiodes 312A~312D. Reset transistor 342 is coupled between a power line and floating diffusion region 320 to reset (e.g., discharge residual charges in floating diffusion region 320 and charge the floating diffusion region 320 to a preset voltage e.g., a supply voltage VDD) under control of a reset signal RST_SIG during a reset or pre-charge period. Reset transistor 342 is further coupled to each individual photodiodes 312A~312D through the respective transfer transistors 330A~330D to reset respective photodiodes 312A~312D to the preset voltage during the reset period. Floating diffusion region 320 is coupled to a gate of source-follower transistor 344. Source follower transistor 344 is coupled between the power line and the row-select transistor 346. A drain of source follower transistor 344 is coupled to the power line to receive the supply voltage VDD, and a source of source follower transistor 344 is coupled to a drain of row-select transistor 346. Source follower transistor 344 operates to modulate an image signal based on the voltage of the floating diffusion region 320, where the image signal corresponds to the amount photo-generated charges accumulated in each corresponding photodiode 312A~312D during the integration period. Row-select transistor 346 selectively couples the output (e.g., image signal) of source follower transistor 344 to a readout column line 348 under a control of a row-select signal RS_SIG.

In operation, during the integration period (also referred to as an exposure or accumulation period), each photodiode 312A~312D detects or absorbs light incident thereon and photo-generates one or more charges in corresponding photodiode region, and each of the transfer transistors 330A~330D is turned off. i.e., transfer gate of the respective transfer transistor 330A~330D receives a cut-off signal (e.g., transfer control signals TX1_SIG~TX4_SIG each with a negative biasing voltage level). The photo-generated charge accumulated in each photodiode 312A~312D is indicative of the amount of light incident thereon. Excess photo-generated charges in each photodiodes 312A~312D are able to overflow or leak to the floating diffusion region 320 through aforementioned first or second anti-blooming paths. Ater the integration period, each of the transfer transistors 330A~330D is turned on forming a conduction channel along the corresponding pair of vertical gate electrodes and underneath the planar gate electrode transferring the one or more photo-generated charges from each photodiode 312A~3121) to the floating diffusion region 320 through the conduction channel upon reception of a transfer signal (e.g., transfer control signals TX1_SIG~TX4_SIG each with a positive biasing voltage level). Source follower transistor 344 generates the image signal based on charges transferred to floating diffusion region 320. Row-select transistor 346 coupled to source follower transistor 344 then selectively reads out the signal onto the corresponding column bitline 348 for subsequent image signal processing such as correlate double sampling, analog-to digital conversion, signal binning.

In embodiments, transfer transistor with vertical gate structures disclosed herein are part of a shared-type pixel cell where floating diffusion region 320 is shared by multiple photodiodes. Transfer transistor with vertical gate structures and anti-blooming mechanism disclosed herein may apply to any of a variety of additional or alternative types of pixel cell, e.g., a four-transistor pixel cell, five-transistor pixel cell, or a six-transistor pixel cell.

Figure 4A:
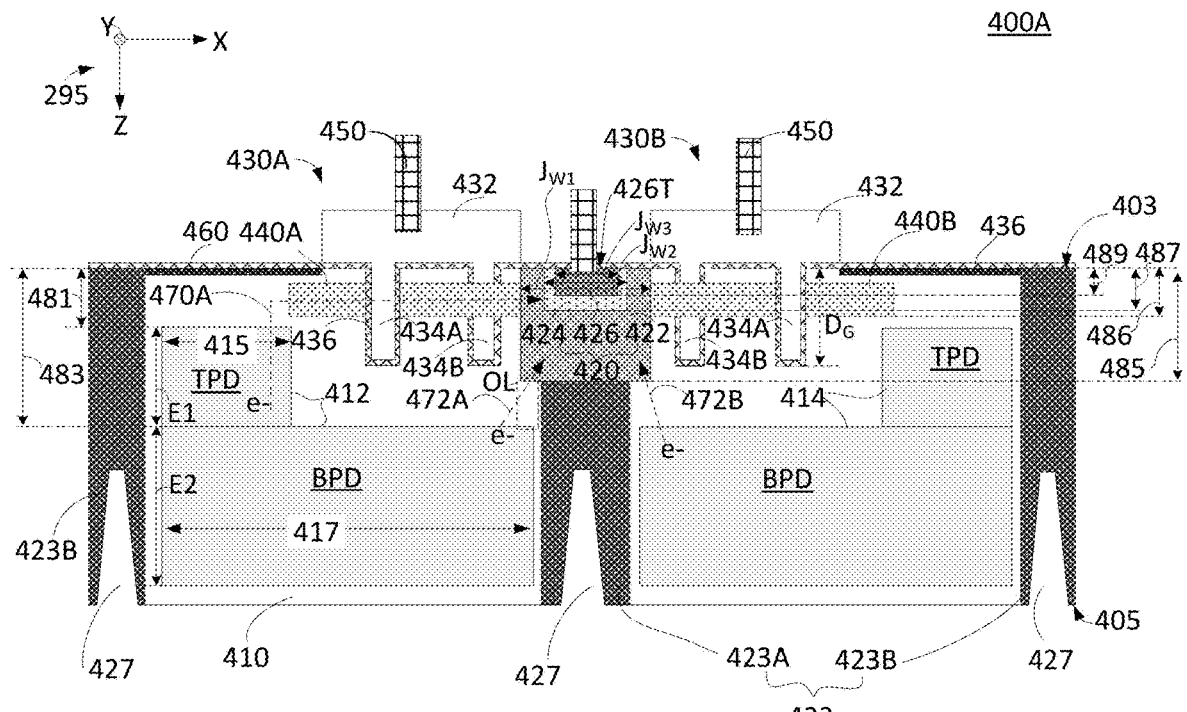
FIGS. 4A-4D are example cross-section views of a pixel cell of FIG. 2A, in accordance with the teachings of the present disclosure.

FIG. 4A illustrates an exemplary cross-section view of FIG. 2A, in accordance with the teachings of the present disclosure. In various examples, pixel cell 400A, similar to pixel cell 200, is one of a plurality of pixel cells arranged in a pixel array of an image sensor (e.g., image sensor 100). The cross-section illustrated in FIG. 4A is parallel to the x-z plane in accordance with a coordinate system 295. Unless otherwise specified, heights of an object herein refers to the object's extent along z-axis, and a width refers to an object's extent along the x- or y-axis, and a vertical direction is along the z-axis.

Pixel cell 400A is formed on a semiconductor substrate 410 (e.g., silicon, a silicon germanium alloy, germanium, a silicon carbide alloy, an indium gallium arsenide alloy, any other alloys formed of III-V compounds, other semiconductor materials or alloys, combinations thereof, a substrate thereof, a doped substrate thereof, a bulk substrate thereof, or a wafer thereof). The semiconductor substrate 410 may also be a semiconductor substrate (e.g., silicon substrate) having an epitaxial layer grown thereon. The semiconductor substrate 410 has a front side surface (or front surface) 403 and a backside surface (or back surface) 405 opposite to the front side surface 403. In embodiments, front side surface 403 may be referred as a non-illuminated surface of the image sensor, and backside surface 405 may be referred as an illuminated surface of the image sensor. A thickness of the semiconductor substrate 410 may range from approximately 2.5 µm to approximately 7 µm depends on the application of the image sensor pixel cell 400A implemented. For a long light wavelength detection application, such as infrared or near infrared detection, the thickness of the semiconductor substrate 410 can be configured to range between 6 µm to 7 µm.

Pixel cell 400A includes a plurality of photodiodes including a first photodiode 412 and a second photodiode 414, a plurality of transfer gates including a first transfer gate 430A and a second transfer gate 430B, a floating diffusion region 420, an isolation well region 423, a deep trench isolation structure 427, a dielectric layer 436, a plurality of contacts 450 disposed within an interlayer dielectric (not illustrated) connecting elements of pixel circuitry (e.g., floating diffusion region 420, transfer gates 430A, 430B) to one or more metallization layers (not illustrated).

The photodiode 412 is coupled to the floating diffusion region 420 through the first transfer gate 430A. The photodiode 414 is coupled to the floating diffusion region 420 through the second transfer gate 430B. Each of the first transfer gate 430A and the second transfer gate 430B includes a planar gate electrode 432 and a pair of vertical gate electrodes including a first vertical gate electrode 434A and a second vertical gate electrode 434B. The planar gate electrode 432 is disposed on the front side surface 403 of the semiconductor substrate 410. The planar gate electrode 432 of the first transfer gate 430A may be disposed on the front side surface 403 of the semiconductor substrate 410 above part of the first photodiode 412. The planar gate electrode 432 of second transfer gate 430B may be disposed on the front side surface 403 of the semiconductor substrate 410 above part of the second photodiode 414. Each of the first vertical gate electrode 434A and the second vertical gate electrode 434B extends from respective planar gate electrode 432 a gate depth $D_G$ into the semiconductor substrate 410 in a depthwise direction (e.g., z-direction in accordance with the coordinate system 295) with respect to front side surface 403. The gate depth $D_G$ may range from approximately 250 nanometers to approximately 400 nanometers with respect to front side surface 403. The first vertical gate electrode 434A and the second vertical gate electrode 434B are spaced apart from each other. Each of the first vertical gate electrode 434A and the second vertical gate electrode 434B may be a pillar structure. Each of the first vertical gate electrode 434A and the second vertical gate electrode 434B may have a cross-sectional shape of circular, square, elliptical, rectangular, or other polygonal-shape. The first vertical gate electrode 434A and the second vertical gate electrode 434B may be referred as vertical transfer gates.

The dielectric layer 436 is formed of an oxide-based material (e.g., $SiO_2$) and disposed on the front side surface 403 of the semiconductor substrate 410. The dielectric layer 436 functions as a gate insulation layer to the first transfer gate 430A and the second transfer gate 430B. The dielectric layer 436 is disposed between planar gates electrode 432 and the front side surface 403, between the first vertical gates electrode 434A and the semiconductor substrate 410, and between the second vertical gate electrode 434B and the semiconductor substrate 410.

Each of the first photodiode 412 and the second photodiode 414 includes a photodiode region having a top photodiode region TPD and a bottom photodiode region BPD disposed in the semiconductor substrate 410. The top photodiode region TPD may be disposed in adjacent to the first and the second vertical gate electrodes of first transfer gate 430A. The top photodiode region TPD is formed at a top photodiode depth 481, with respect to the front side surface 403, that is less than the gate depth $D_G$ of the first vertical gate electrode 434A or the gate depth $D_G$ of the second vertical gate electrode 434B of the corresponding transfer gate (e.g., the first transfer gate 430A or the second transfer gate 430B). The top photodiode region TPD extends toward the backside surface 405. The bottom photodiode region BPD is located beneath the first and second vertical gate electrodes of the respective transfer gate (e.g., underneath the first transfer gate 430A or the second transfer gate 430B). The bottom photodiode section BPD adjoins the top photodiode region TPD. The bottom photodiode section BPD begins at a bottom photodiode depth 483 and extends from the top photodiode region BPD) toward backside surface 405. The bottom photodiode depth 483 is greater (or deeper) than the top photodiode depth 481 of the top photodiode region TPD. The bottom photodiode depth 483 is further greater than the gate depth $D_G$. The bottom photodiode region BPD may have a width 417 (e.g., along x-direction in accordance with a coordinate system 295) that exceeds a width 415 of the top photodiode region TPD. Multiple ion implantations with different doses and/or implantation energies may be used to form the top photodiode region TPD and the bottom photodiode region BPD for respective photodiode. The top photodiode region TPD and the bottom photodiode region BPD are of same conductive type e.g., n-type, that is opposite to that of the isolation well region 423 and the semiconductors substrate 410. An extended depth E2 of bottom photodiode region from the bottom photodiode depth 483 may be greater than an extended depth E1 of top photodiode region TPD (e.g., extended depth E1 refers to the distance between top photodiode depth 481 and the bottom photodiode depth 483) from top photodiode depth 481 along the z-direction in accordance with a coordinate system 295.

In the illustrated embodiments, photodiodes 412, 414 are pinned photodiodes and each includes a pinning region 460 disposed between the corresponding photodiode region of individual photodiodes 412, 414 and the front side surface 403 of the semiconductor substrate 410. The pinning region 460 may be disposed between the top photodiode region TPD of individual photodiodes 412, 414 and the front side surface 403 of the semiconductor substrate 410. The pinning region 460 is at least partly disposed between a corresponding buried channel doped region and the front side surface 403 of the semiconductor substrate 410. For example, the pinning region 460 is further partly disposed between each of the buried channel doped regions 440A, 440B and the front side surface 403 of the semiconductor substrate 410. The pinning region 460 may be partly disposed between a corresponding buried channel doped region and the corresponding photodiode region of individual photodiodes 412, 414. For example, the pinning region 460 may partly disposed between each of the buried channel doped regions 440A, 440B and the top photodiode region TPD of respective photodiodes 412, 414. It is appreciated, that in some embodiments, the pinning region 460 has a cross-sectional area (e.g., an area in x-y plane) at least larger than a cross-sectional area of the top photodiode region TPD of associated photodiode (i.e., the pinning region 460 associated with the photodiode 412 has a cross-sectional area being larger than a cross-sectional area of the top photodiode region TPD of photodiode 412 in x-y plane). The pinning region 460 may have a conductive type that is same is as that of the isolation well region 423 but opposite conductive type to the photodiode region (e.g., the top photodiode region TPD and the bottom photodiode region BPD) of associated photodiode. The pinning region 460 may be grounded e.g., coupled to an electrical ground.

The isolation well region 423 similar to isolation well region 223 includes an inner isolation well region (or first isolation well region) 423A and an outer isolation well region (or second isolation well region) 423B disposed in the semiconductor substrate 410. The inner isolation well region 423A is disposed or arranged between adjacent photodiodes 412, 414 within pixel cell 400A. For example, the inner isolation well region 423A is between the photodiode region of the photodiode 412 and the photodiode region of the photodiode 414 providing electrical isolation therebetween. The outer isolation well region 423B is disposed or arranged between photodiodes 412, 414 of the pixel cell 400A and photodiodes of adjacent pixel cell 400A. The outer isolation well region 423B may surround each of photodiodes 412, and 414 electrically separate the photodiode regions associated with each of photodiodes 412, 414 from the photodiode regions associated with photodiodes adjacent thereto in adjacent pixel cell. The outer isolation well region 423B may further electrically isolate each of photodiodes 412, 414 from pixel transistors associated with pixel cell 400A or adjacent pixel cell. In embodiments, the inner isolation well region 423A and the outer isolation well region 423B may be interconnected forming an isolation grid surrounding each of the photodiodes 412, 414, similar to the inner isolation well region 223A and the outer isolation well region 223B illustrated in FIG. 2A.

Each of the inner isolation well region 423A and the outer isolation well region 423B may extend away from front side surface 403 toward the backside surface 405 along z-direction in accordance with the coordinate system 295. In embodiments, each of the inner isolation well region 423A and the outer isolation well region 423B may be formed by multiple ion implantation processes under same or different doses with different implantation energies. The inner isolation well region 423A and the outer isolation well region 423B may be grounded e.g., connected to a ground voltage. In embodiments, the pinning region 460 may be electrically connected to inner isolation well region 423A and/or the outer isolation well region 423B of isolation well region 423.

As illustrated in FIG. 4A, there is a substrate region between the inner isolation well region 423A and the corresponding bottom photodiode regions BPD of photodiodes 412, 414. It is appreciated that in some embodiments, the inner isolation well region 423A abuts the bottom photodiode region BPD of the photodiode 412 and the bottom photodiode region BPD of the photodiode 414. Similarly, the outer isolation well region 423A abuts the corresponding top photodiode regions and bottom photodiode regions BPD) of the photodiodes 412, 414.

The pixel cell 400A may include a first buried channel doped region 440A and a second buried channel doped region 440B disposed in the semiconductor substrate 410 proximate to front side surface 403. The first buried channel doped region 440A and the second buried channel doped region 440B may be part of the buried channel implant region 240. Each of the first buried channel doped region 440A and the second buried channel doped region 440B has a buried channel junction depth 486, with respect to the front side surface 403, being less than the gate depth $D_G$ of the first vertical gate electrode 434A or the gate depth $D_G$ of the second vertical gate electrode 434B. The buried channel junction depth 486 is less than or the same as the corresponding the top photodiode depth 481 of respective photodiode 412 or 414.

The buried channel doped region 440A is disposed proximate to the top photodiode region TPD of photodiode 412. The buried channel doped region 440A is disposed between the first and the second vertical gate electrodes 434A. 4341 of the transfer gate 430A to facilitate coupling between photodiode 412 and the floating diffusion region 420. The buried channel doped region 440A may be implanted in a such manner that it forms a buried channel region between the first and second vertical gate electrodes 434A, 434B of transfer gate 430A, and the formed buried channel region extends from the floating diffusion region 420 toward corresponding top photodiode region TPD of photodiode 412 through the spacing (or the substrate region) between the first and the second vertical gate electrodes 434A, 434B of the transfer gate 430A, thereby enabling a first anti-blooming path 470A between photodiode 412 and the floating diffusion region 420. The buried channel doped region 440B is disposed proximate to the top photodiode region TPD of photodiode 414. The buried channel doped region 440B is disposed between the first and the second vertical gate electrodes 434A, 434B of the transfer gate 430B to facilitate coupling between photodiode 414 and the floating diffusion region 420. The buried channel doped region 440B may be implanted in a such manner that it forms a buried channel region between the first and second vertical gate electrodes 434A, 434B of transfer gate 430B, and the formed buried channel region extends from the floating diffusion region 420 toward corresponding top photodiode region TPD of photodiode 414 through the spacing (or the substrate region) between the first and the second vertical gate electrodes 434A. 434B of the transfer gate 430B, thereby enabling a first anti-blooming path 470B (FIG. 4B) between photodiode 414 and the floating diffusion region 420.

Each of first buried channel doped region 440A and the second buried channel doped region 440B is of the same conductive type as the photodiode regions (e.g., the top photodiode region TPD and the bottom photodiode region BPD) of the corresponding photodiodes 412, 414. Each of first buried channel doped region 440A and the second buried channel doped region 440B is formed by implanting dopants having same conductive type as photodiode regions of photodiodes 412, 414 (e.g., arsenic or phosphorus) at a dose on the order of $1E12$ ions/cm$^2$. The first buried channel doped region 440A and the second buried channel doped region 440B may each have a concentration ranging between $1E18$ ions/cm$^3$ to $1E20$ ions/cm$^3$. It is appreciated that in some embodiments, the concentration of the first buried channel doped region 440A and the concentration of the second buried channel doped region 440B may be different, e.g., to adjust individually based on acceptable blooming level and dark current noise level.

The floating diffusion region 420 may be formed of two or more doped regions, each having different junction depths with respect to front side surface 403. The doped region having the deepest junction depth is greater than the gate depth $D_G$ of the first vertical gate electrode 434A or the gate depth $D_G$ of the second vertical gate electrode 434B associated with the transfer gate 430A (or the transfer gate 430B) such that the doped region having the deepest junction depth of floating diffusion region 420 being close to photodiode region (e.g., the bottom photodiode region BPD) of the corresponding photodiode 412, 414.

In the embodiment illustrated by FIG. 4A, the floating diffusion region 420 includes a first doped region 422, a second doped region 424 and a third doped region 426. The first doped region 422, the second doped region 424, and the third doped region 426 are disposed in the semiconductor substrate 410.

The first doped region 422 has a first junction depth 485 with respect to front side surface 403, and a first junction width $J_{W1}$ along the x-direction. The first doped region 422 extends from the front side surface 403 to the first junction depth 485. The first junction depth 485, with respect to front side surface 403, is greater than the gate depth $D_G$ of the first vertical gate electrode 434A or the gate depth $D_G$ of the second vertical gate electrode 434B. The first junction depth 485 may range from approximately 400 nanometers to approximately 500 nanometers, and may be configured based on the bottom photodiode depth 483.

The first doped region 422 may extend toward photodiode region (e.g., bottom photodiode region BPD) of the photodiode 412, 414. The first doped region 422 may extend and be adjacent to bottom photodiode regions BPD of the photodiodes 412, 414. The first doped region 422 may extend and abut (or in direct contact with) the inner isolation well region 423A. Restated, the first doped region 422 is between front side surface 403 and the inner isolation well region 423A such that the first doped region 422 is not in direct contact with each individual the photodiode 412, 414, e.g., not in direct contact with the bottom photodiode region BPD of each photodiode 412, 414.

In embodiments, a part of the first doped region 422 of floating diffusion region 420 may be arranged above a part of the bottom photodiode region BPD of each photodiode 412, 414 in the z-direction as illustrated by a box OL. Restated, a part of the first doped region 422 is in between the bottom photodiode region BPD of each photodiode 412, 414 and the front side surface 403. Having part of the first doped region 422 formed above part of the bottom photodiode region BPD of each photodiode 412, 414 along z-direction while distanced from the bottom photodiode region BPD of each photodiode 412, 414 facilitates electrical coupling between the bottom photodiode region BPD of each photodiode 112, 414 and the first doped region 422 of floating diffusion region 420 and forms a second anti-blooming path between each of photodiodes 412, 414 and floating diffusion region 420 such that excess photo-generated changes may overflow to the floating diffusion region 420 during the integration period when respective transfer gates 430A and 430B are turned off (e.g., with negatively-biased voltage signal). For instance, excess photo-generated changes can overflow from bottom photodiode region BPD of photodiode 412 to the first doped region 422 through the second anti-blooming path 472A and stored in the floating diffusion region 420 (e.g., stored in depiction regions associated with the first, the second, and the third doped regions 422, 424, 426). Similarly, excess photo-generated changes can overflow from bottom photodiode region BPD of photodiode 414 to the first doped region 422 through the second anti-blooming path 472B and stored in the floating diffusion region 420 (e.g., stored in depletion regions associated with the first, the second, and the third doped regions 422, 424, 426).

In embodiments, a separation distance exists between the first doped region 422 and the bottom photodiode region BP) of the photodiode region of each photodiode 412, 414, and the separation distance is less than a distance between the first doped region 422 and the top photodiode region TPD of the photodiode region of each photodiode 412, 414. The separation distance may range from approximately 100 nanometers to approximately 300 nanometers. The separation distance is arranged between the first doped region 422 and the bottom photodiode region BPD of each photodiode 412, 414 to control the leakage level of the second anti-blooming paths 472A, 472B and the full well capacity of each of photodiodes 412, 414. It is appreciated that if the separation distance is configured to be too small e.g., less than 100 nanometers, the leakage level of each of the second anti-blooming paths 472A, 472B would become too high and may have adverse impact of low full well capacity of each of photodiodes 412, 414.

The first buried channel doped region 440A and the second buried channel doped region 440B are disposed proximate to front side surface 403. It is observed that the higher the concentration that each of the first buried channel doped region 440A and the second buried channel doped region 440B has, the lower the blooming level but higher the dark current induced in each respective photodiode 412 or 414. Tuning concentrations of the first buried channel doped region 440A and the second buried channel doped region 440B are needed to provide anti-blooming path for corresponding photodiodes 412, 414 at acceptable dark current noise level.

The second anti-blooming paths 472A, 472B induced by the first doped regions 422 are located deeper than the first anti-blooming paths 470A, 470B away from the front side surface 403 (i.e., away from oxide silicon surface, which contains surface defects that could resulted in unwanted dark current noise affecting photodiode sensitivities) providing a charge leakage path for blooming control without having, negative impact of dark current noises compare to first anti-blooming paths 470A, 470B. The existence of second anti-blooming paths 472A, 472B between photodiodes 412, 414 and floating diffusion region 420 thus allows each of first buried channel doped region 440A and the second buried channel doped region 440B to be configured with lower concentration (e.g., concentration resulted in acceptable dark current noise level) without degrading blooming performance.

The second doped region 424 has a second junction depth 487 with respect to front side surface 403, and a second junction width $J_{W2}$ along the x-direction. The second doped region 424 extends from front side surface 403 to the second junction depth 487. The second junction depth 487, with respect to front side surface 403, is less than the first junction depth 485. The second junction depth 487, with respect to front side surface 403, is further less than the gate depth $D_G$ of the first vertical gate electrode 434A or the gate depth $D_G$ of the second vertical gate electrode 434B. The second junction width $J_{W2}$ of the second doped region 424, for example along x-direction, is less than the first junction width $J_{W1}$ of the first doped region 422. The second doped region 424 is disposed within the first doped region 422. The second doped region 424 may be surrounded by the first doped region 422. The second doped region 424 may be embedded in the first doped region 422.

The third doped region 426 has a third junction depth 489 with respect to front side surface 403 and a third junction width $J_{W3}$ along the x-direction. The third doped region 424 extends from front side surface 403 to the third junction depth 489. The third junction depth 489, with respect to front side surface 403, is less than the first junction depth 485. The third junction depth 489, with respect to front side surface 403, is also less than the second junction depth 487. The third doped region 426 is disposed within the first doped region 422. The third doped region 426 may be surrounded by the second doped region 424. The third doped region 426 is embedded in the second doped region 424. The third junction width $J_{W3}$ of the third doped region 426 is less than the second junction width $J_{W2}$ of the second doped region 424. The third doped region 426 may be configured to provide an ohmic contact surface 426T for contact 450 to contact floating diffusion region 420 and form electrical connection between floating diffusion region 420 and other pixel elements such as the gate SF of source follower transistor 492.

In embodiments, the third doped region 426 may have a higher concentration than either the first doped region 422 or the second doped region 424. The first doped region 422 may be formed by implanting dopants having same conductive type as photodiode regions of photodiodes 412, 414 (e.g., arsenic or phosphorus) at a dose on the order of approximately 1E12 ions/cm$^2$. The first doped region 422 may have a concentration on an order of about 1E18 ions/cm$^3$. The second doped region 424 may have a higher concentration than the first doped region 422 and on an order of approximately 1E19 ions/cm$^3$. The second doped region 424 may be formed of by implanting dopants having same conductive type as photodiode regions of photodiodes 412, 414 at a dose between approximately 1E13 ions/cm$^2$ to approximately 1E14 ions/cm$^2$. The third doped region 426 may be formed of by implanting dopants having same conductive type as photodiode regions of photodiodes 412, 414 in single or multiple ion implementations with a highest dose on the order of approximately 1E15 ions/cm$^2$. The third doped region 426 may have a concentration ranging from approximately 1E20 ions/cm$^3$ to 1E21 ions/cm$^3$. The concentration profile of the first and second doped regions 422, 424 is configured to allow transfer of image signal charges during charge transfer or overflowed of excess charges during integration to be stored in the depletion region associated floating diffusion region 420 proximate to front side surface 403 for subsequent read out operation.

It is appreciated that similar to third doped region 426, each of first and second doped regions 422, 424 may be formed in a single or multiple ion implantation processes at one or more doses with single or multiple implantation energy to achieve target concentration. For instance, the first doped region 422, being a doped region of floating diffusion region 420 having the deepest junction depth may be disposed by performing one or more implantation processes of various implantation energies (e.g., each ranging from approximately 15 KeV to approximately 600 KeV) such that the first doped region 422 extends to the first junction depth 485. It is appreciated that the number implantation process and individual implantation process conditions (e.g., implantation energy and dose) can be optimized to form the first doped region 422 of floating diffusion region 420 with targeted deepest junction depth and specific concentration that optimizes blooming performance of pixel cell 400A (e.g., controlling leakage condition between the bottom photodiode region BPD of each photodiode 412, 414 and floating diffusion region 420).

In operation, when transfer gates 430A, 4301B are turned off (e.g., negatively biased) during the integration period, excess photo-generated charges from each of photodiodes 412, 414 may overflow to the floating diffusion region 420 through their respective first anti-blooming paths 470A, 470B and/or second anti-blooming paths 472A, 472B instead to adjacent photodiodes. For example, during the integration period, excess photo-generated charges can overflow from top photodiode region TPD of photodiode 412 to floating diffusion region 420 through first anti-blooming path 470A and/or from bottom photodiode region BPD of photodiode 412 to floating diffusion region 420 through the second anti-blooming path 472A. Similarly, excess photo-generated charges can overflow from top photodiode region TPD of photodiode 414 to floating diffusion region 420 through first anti-blooming path 470B and/or from bottom photodiode region BPD of photodiode 414 to floating diffusion region 420 through the second blooming path 472B. As such, occurrence of blooming between adjacent photodiodes can be effectively reduced.

The plurality of contacts 450 may include contacts disposed to electrically connect the first transfer gate 430A and the second transfer gate 430B respectively to a control circuit (e.g., control circuit 130 of FIG. 1) to receive transfer control signals (i.e., transfer signal or cut off signal) through one or more metallization layers, and a contact that electrically connect floating diffusion region 420 to a gate SF of the source follower transistor 492 (FIG. 4C) through one or more metal interconnects.

In embodiments, each of the inner isolation well region 423A and the outer isolation well region 423B has a conductive type opposite to photodiode regions of photodiodes 412, 414 and floating diffusion region 420.

The deep trench isolation structure 427 is disposed within the semiconductor substrate 410 proximate to the backside surface 405. The deep trench isolation structure 427 extends from backside surface 405 a depth into the semiconductor substrate 410 toward the front side surface 405, wherein the depth that the deep trench isolation structure 427 extended in the semiconductor substrate 410 may be less than or equal to a thickness of the semiconductor substrate 410. The deep trench isolation structure 427 may extend into each of the inner and outer isolation well regions 423A, 4231B from the backside surf ace 405 such that the deep trench isolation structure 427 is surrounded by the inner or the outer isolation well regions 423A, 423B.

The deep trench isolation structure 427 is disposed between photodiode regions of adjacent photodiodes within the same pixel cell (e.g. between photodiode regions of adjacent photodiodes in pixel cell 400A) or adjacent pixel cells (e.g., between photodiode regions of photodiodes 412, 414 and corresponding photodiode regions located in adjacent pixel cell providing electrical and/or optical isolation between any adjacent photodiodes.

The deep trench isolation structure 427 may be an oxide filled isolation structure or a metal filled isolation structure or a combination of oxide and metal filled isolation structure like deep trench isolation structure 227. The deep trench isolation structure 4727 may be arranged in a grid form to isolate photodiode regions of adjacent photodiodes. The deep trench isolation structure 427 surrounds each of photodiode 412, 414 providing intra photodiode isolation within pixel cell 400A and inter photodiode isolation between adjacent pixel cells.

Figure 4B:
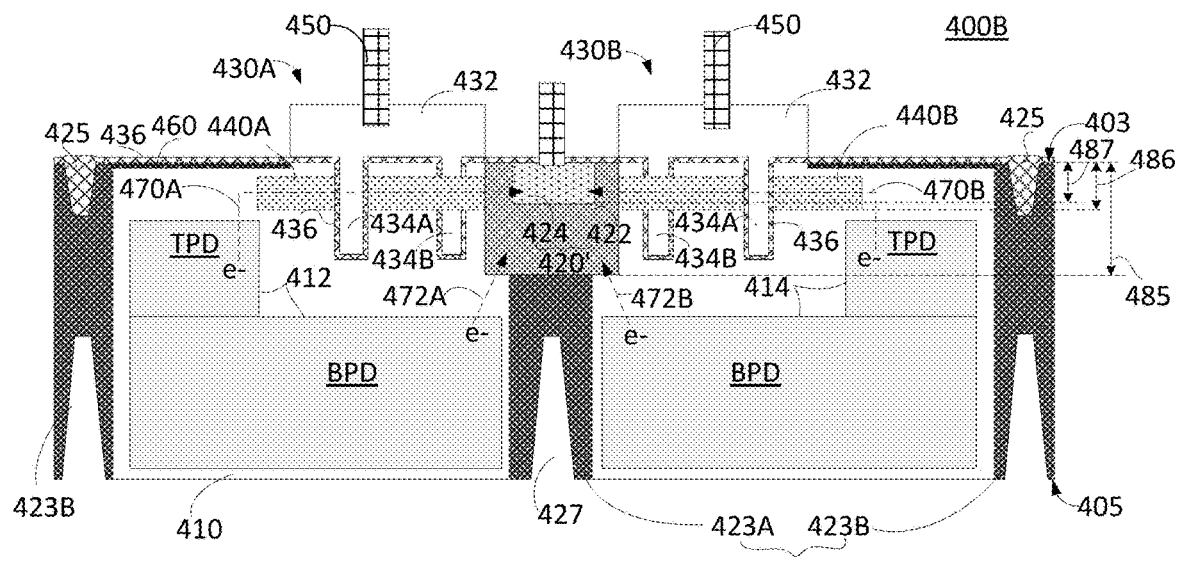

FIG. 4B is a cross-section view of another example of a pixel cell 400B with floating diffusion having multiple doped regions for blooming control, in accordance with the teachings of the present invention. It is noted that pixel cell 400B of FIG. 4B may be another cross-sectional view of FIG. 2A, and that similarly named and numbered elements referenced below are coupled and function similar to as described above. Indeed, it is appreciated that pixel cell 400B of FIG. 4B shares many similarities with cross-sectional view of pixel cell 400A depicted FIG. 4A. As such, it is appreciated that the differences between pixel cell 400A and pixel cell 400B will be described in detail herein for the sake of brevity and in order to avoid obscuring the teachings of the present invention.

One of the differences between pixel cell 400B of FIG. 4B and pixel cell 400A of FIG. 4A is that a floating diffusion region of pixel cell 400B of FIG. 4B may include only two doped regions having different junction depths. As illustrated, a floating diffusion region 420' includes a first doped region 422 and a second doped region 424. The first doped region 422 has a first junction depth 485 with respect to front side surface 403 being greater than a buried channel junction depth 486 associated with the first buried channel doped region 440A or the second buried channel doped region 440B. The first junction depth 485 is also greater than a gate depth $D_G$ of either first vertical gate electrode 434A or second vertical gate electrode 434B associated with the transfer gate 430A or transfer gate 430B. The second doped region 424 has a second junction depth 487 with respect to front side surface 403 being less than the gate depth $D_G$ of either first vertical gate electrode 434A or second vertical gate electrode 434B associated with the transfer gate 430A or transfer gate 430B. The second junction depth 487 is less than the first junction depth 485. The second junction depth 487 may be further less than the buried channel junction depth 486 associated with the first buried channel doped region 440A or the second buried channel doped region 440B. Each of the first buried channel doped region 440A and the second buried channel doped region 440B is disposed proximate to top photodiode regions TPD of corresponding photodiodes 412, 414 enables the formation of the first anti-blooming paths 470A, 470B for excess photo-generated charges to overflow from top photodiode regions TPD of each individual photodiodes 412, 414 to floating diffusion region 420'. The second doped region 424 is disposed proximate to bottom photodiode regions BPD of each of photodiodes 412, 414 enables the formation of second anti-blooming paths 472A, 472B for excess photo-generated charges to overflow from bottom photodiode regions 1P) of each individual photodiodes 412, 414 to floating diffusion region 420'. The corresponding contact 450 contacts the first doped region 422. In the illustrated embodiments, the second doped region 424 may have a concentration greater than the first doped region 422.

Pixel cell 400B may further includes a plurality of shallow trench isolations structures 425. Each of shallow trench isolations structures 425 may be disposed proximate to front side surface 403 surrounding pixel cell 400B. Each of shallow trench isolations structures 425 may be an oxide filled (e.g., silicon oxide filled) trench isolation structure. Each of shallow trench isolations structures 425 may extend into an isolation well region 423. For example, each extended from front side surface 403 into semiconductor substrate 410 into an outer isolation well region 423B of isolation well region 423. In some embodiments, a vertically aligned pair of the shallow trench isolation structures 425 and deep trench isolation structure 427 are disposed within isolation well region 423 to form an isolation structure for pixel cell 400B.

It is appreciated in some embodiments, the first buried channel doped region 440A and the second buried channel doped region 440B may be omitted to reduce fabrication complexity and effort to tune concentration of the first buried channel doped region 440A and the second buried channel doped region 440B to balance dark current issue and blooming. With the illustrated floating diffusion region structure provides second blooming paths 472A, 472B between floating diffusion region 420' and photodiode 412, 414, respectively, required or target blooming performance of an image sensor can be achieved even without the presence of the first buried channel doped region 440A and the second buried channel doped region 440B, at the same time minimize or prevent dark current induced white pixel issued associated with buried channel doped regions 440A, 440B.

Figure 4C:
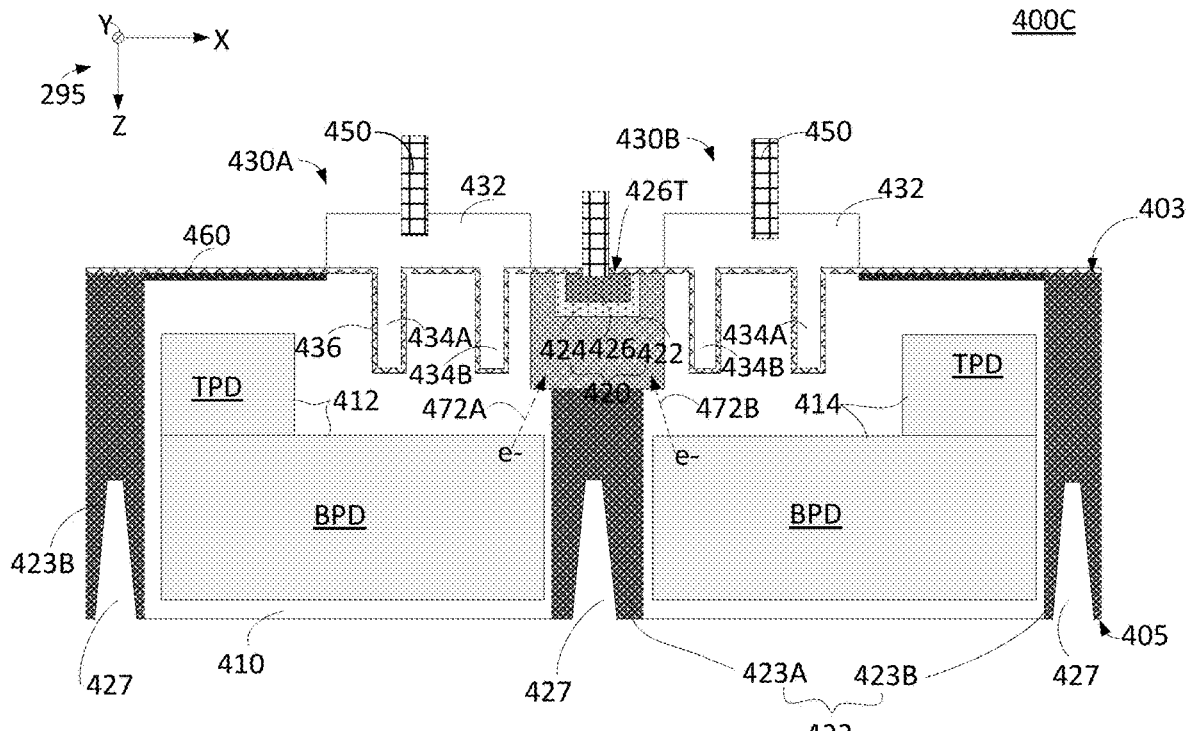

FIG. 4C is a cross-sectional view of another example of a pixel cell 400C with floating diffusion having multiple doped regions for blooming control, in accordance with the teachings of the present invention. It is noted that pixel cell 400C of FIG. 4B may be another cross-sectional view of FIG. 2A, and that similarly named and numbered elements referenced below are coupled and function similar to as described above. Indeed, it is appreciated that pixel cell 400C of FIG. 4C shares many similarities with cross-sectional view of pixel cell 400A depicted FIG. 4A. One difference between pixel cell 400C of FIG. 4C and pixel cell 400A of FIG. 4A is that the pixel cell 400C omits the first buried channel doped region 440A and the second buried channel doped region 440B and includes only second anti-blooming paths 472A, 472B formed from electrical coupling between a first doped region 422 of a floating diffusion region 420 and each of photodiodes 412, 414 allowing excess photo-generated charges to overflow from respective photodiodes 412, 417 into floating diffusion region 420.

Figure 4D:
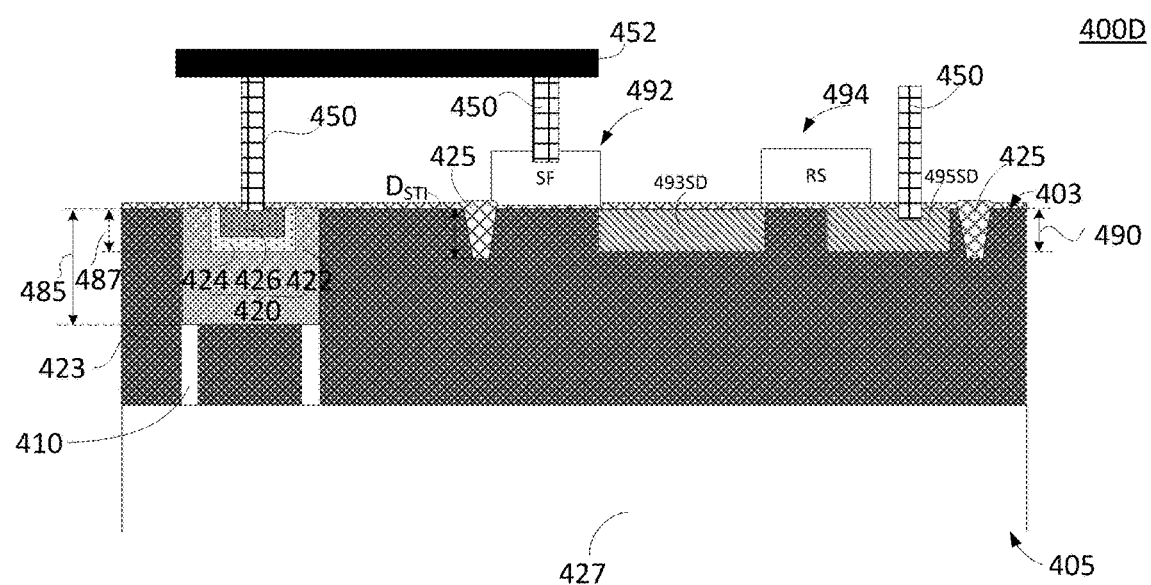

FIG. 4D is a cross-sectional view of another example of a pixel cell 400D with floating diffusion having multiple doped regions for blooming control, in accordance with the teachings of the present invention. It is noted that pixel cell 400D of FIG. 4D may be another cross-sectional view of FIG. 2A such as along a cutline W-W', and that similarly named and numbered elements referenced below are coupled and function similar to as described above.

Pixel cell 400D includes a plurality of shallow trench isolation structures 425 disposed in a semiconductor substrate 410 between photodiodes and pixel transistors associated with corresponding pixel cell 400D or adjacent pixel cell, and between floating diffusion region 420 and pixel transistors. Each of the plurality of shallow trench isolations structures 425 may have an isolation depth $D_{STI}$ with respect to a front side surface 403 of the semiconductor substrate 410. The isolation depth $D_{STI}$ may range from approximately 200 nanometers to approximately 300 nanometers. In the illustrated embodiment, the pixel transistors includes a source follower transistor 492 and a row-select transistor 494 associated with pixel cell 400D.

A floating diffusion region 420 may be coupled to a gate SF of the source follower transistor 492 through corresponding contacts 450 and one or more metallization layers (e.g., a metal interconnect 452 in a first metallization layer). A source/drain 493SD is shared between source follower transistor 492 and row-select transistor 494, where source/drain 493SD may serve as a source to source follower transistor 492 and a drain to the row-select transistor 494. A source/drain 495SD may serve as source to the row-select transistor 494, and couple to a column bitline (e.g., readout column bitline 120) through corresponding contacts 450 and one or more metallization layers.

The first doped region 422 may have a first junction depth 485 being greater than a source-drain junction depth 490 of either source/drain 493SD or 495SD. Although not illustrated, the source follower transistor 492 may include a drain having a junction depth (e.g., respective source-drain junction depth) being less than the first junction depth 485. The first junction depth 485 is further greater than the isolation depth $D_{STI}$ of each individual shallow trench isolation structure 425. The second doped region 424 may have a second junction depth 487 being the same as the source-drain junction depth 490 of either source/drain 493SD or 495SD and less than the isolation depth $D_{STI}$ of each individual shallow trench isolation structure 425. The concentration of each of source/drain 493SD and 495SD may be on an order of approximately 1E20 ions/cm$^3$. The concentration of each of source/drain 493SD and 495SD may be greater than the concentration of the first doped region 422.

Figure 5:
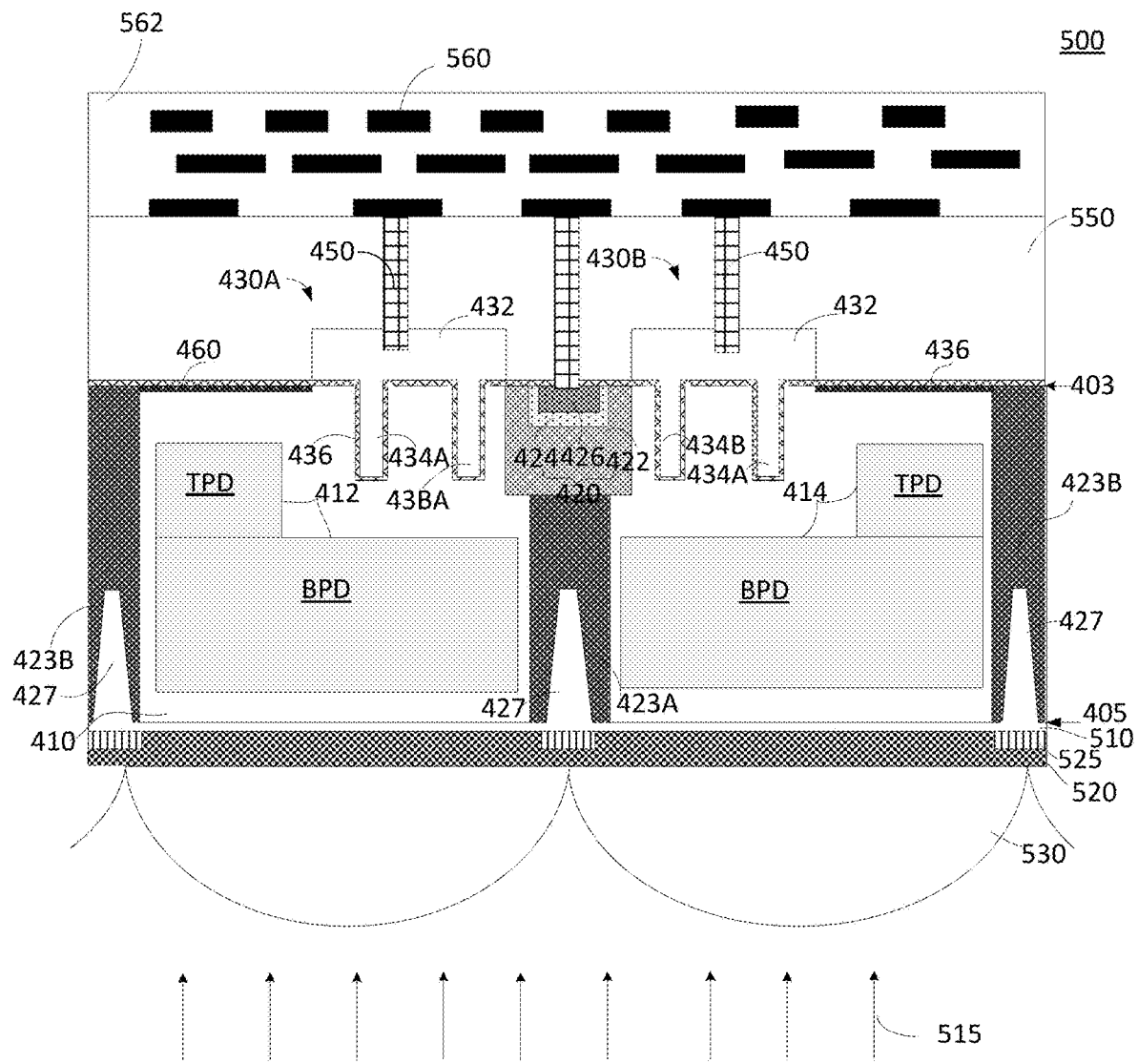
FIG. 5 illustrates example cross-section view with color filter array and microlens array in accordance with the teachings of the present disclosure.

FIG. 5 is a cross-section view of another example of a pixel cell 500 with the floating diffusion region structure in accordance with the teachings of the present invention. Pixel cell 500 like pixel cells 200, 400A-C may be one of a plurality of pixel cells arranged in a pixel array of an image sensor (e.g., image sensor 100). It is appreciated that the example pixel cell 500 of FIG. 5 may be examples of pixel cell 400A with addition of metallization layers, array of color filters and array of microlenses, and that similarly named and numbered elements referenced below are coupled and function as described above.

Photodiodes 412, 414 are disposed proximate to a front side surface (or front surface) 403 of a semiconductor substrate 410 to generate image charge in response to incident light 515 that is directed through a backside surface (or back surface) 405 of the semiconductor layer 410 to the individual photodiodes 412, 414.

Pixel cell 500 shown in FIG. 5 includes an interlayer dielectric layer 550 and one or more metallization layers 560. The interlayer dielectric layer 550 is disposed proximate to the front side surface 403 of the semiconductor substrate 410 (e.g., such that a dielectric layer 436 is disposed between the interlayer dielectric layer 550 and the semiconductor substrate 410). The interlayer dielectric layer 550 encapsulates, at least in part, contacts 450, gate electrodes (e.g., the transfer gate 430A, 430B illustrated in FIG. 5). Although not illustrated, it is appreciated that the interlayer dielectric layer 550 may also encapsulate, at least in part a gate SF of a source follower transistor 492, a gate RS of a row-select transistor 494, or a gate RST of reset transistor. The one or more metallization layers 560 may be embedded in a multi-layer inter-metal dielectric layer 562 and disposed on the interlayer dielectric layer 550. A plurality of contacts 450 may electrically connect corresponding pixel elements (e.g., floating diffusion region 420, transfer gates 430A, 430B, gates or sources/drains associated with pixel transistors, etc.) to one or more metallization layers 560 (e.g., a first metallization layer of one or more metallization layers 560) for signal routing and necessary connections supporting pixel operation.

Pixel cell 500 further includes a multi-layer dielectric stack 510 formed over the backside surface 405 of the semiconductor substrate 410. The multi-layer dielectric stack 510 may include a buffer layer (e.g., an oxide layer) and an anti-reflection layer formed over the buffer layer. The anti-reflection layer may include one or more layers of dielectric material, such as silicon nitride, aluminum oxide, hafnium oxide, tantalum oxide, or other suitable materials or a combination thereof. Optionally, a passivation layer (not illustrated) may be disposed between multi-layer dielectric stack 510 and the backside surface 403 of the semiconductor substrate 410 for surface passivation to reduce dark current and white pixels. The passivation layer may be formed of a high κ material, such as aluminum oxide, hafnium oxide, tantalum oxide.

A color filter array layer 520 including a plurality of color filters is formed over the multi-layer dielectric stack 510. In one example, the plurality of color filters may have an arrangement based on a Bayer pattern. In one example, the plurality of color filters may include a combination of red, blue, and green color filters. In another example, the plurality of color filters may include a combination of red, blue, and clear color filters. In still another example, the plurality of color filters may include a combination of red, blue, green and infrared color filters. In the depicted example, a metal grid 525 is formed between each individual color filters of the color filter array layer 520. The metal grid 525 may be vertically aligned with a deep trench isolation structure 427 and define a plurality of apertures aligning with light sensing regions of photodiodes 412, 414. An array of microlenses including a plurality of microlenses 530 is formed over the color filter layer 520. In the illustrated embodiments, each plurality of microlenses 530 is aligned with respective photodiodes 412, 414. It is appreciated that in some embodiments, a microlens 530 may be arranged to form over multiple photodiodes in a pixel cell for special imaging application, such as phase detection. For instance, a single microlenses 530 may be disposed covering entire light sensing region of pixel cell 500 to direct incident light to photodiodes 412, 414.

In operation, incident light 515 is directed passes through a respective microlens 530, color filters multi-layer dielectric stack 510, backside surface 405 through semiconductor layer 410 to each individual photodiodes 412, 414. Excess photo-generated charges in each of photodiode 412, 414 can overflow to the floating diffusion region 420 through the respective anti-blooming paths 472A, 472B into a first doped region 422 of the floating diffusion region 420 and stored in the floating diffusion region 420 (e.g., stored in depletion regions associated with first, second, and third doped regions 422, 424, 426), reduces or even prevents the occurrence of blooming, thereby improving overall imaging quality of the image sensor.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, disposed on a semiconductor substrate having a front surface and a backside surface, the pixel cell comprising:
   a photodiode disposed in the semiconductor substrate, the photodiode comprising a photodiode region of a second conductive type opposite to a first conductive type of the semiconductor substrate;
   a first doped region disposed in the semiconductor substrate, the first doped region extending from the front surface to have a first junction depth in the semiconductor substrate along a depth direction perpendicular to the front surface, wherein the first doped region is of the second conductive type;
   a second doped region of the second conductive type extending from the front surface to have a second junction depth in the semiconductor substrate, the second junction depth being less than the first junction depth with respect to the front surface, wherein the second doped region is coupled to the first doped region, and the second doped region is surrounded by the first doped region; and
   a transfer gate, selectively coupling the photodiode to the first doped region, the transfer gate configured to transfer image charges from the photodiode to the first doped region, the transfer gate having a planar gate electrode on the front surface of the semiconductor substrate and at least one vertical gate electrode, the at least one vertical gate electrode extending from the planar gate electrode, along the depth direction, a gate depth into the semiconductor substrate;
   wherein the first junction depth is greater than the gate depth;
   wherein both the first doped region and the second doped region are distanced from the photodiode region of the photodiode;
   wherein a first concentration of the first doped region is less than a second concentration of the second doped region.

2. The pixel cell according to claim 1, further comprising:
   wherein the second doped region is disposed within the first doped region;
   wherein the second junction depth of the second doped region is less than the gate depth of the at least one vertical gate electrode with respect to the front surface;
   wherein the first doped region and the second doped region form a floating diffusion region for storing image charges and overflow charges received from the photodiode.

3. The pixel cell according to claim 1, wherein the floating diffusion region further includes a third doped region disposed in the second doped region, the third doped region extending from the front surface to have a third junction depth along the depth direction in the semiconductor substrate, wherein the third junction depth is less than the second junction depth, and the third doped region has a third concentration being greater than at least one of a first concentration of the first doped region and a second concentration of the second doped region; wherein the third doped region is surrounded by the first doped region.

4. The pixel cell according to claim 1, wherein, the photodiode region including (i) a bottom photodiode region at a bottom photodiode depth greater than the gate depth of the at least one vertical gate electrode with respect to the front surface, extending along the depth direction, from the bottom photodiode depth to an extend depth that is greater than the first junction depth and (ii) a top photodiode region adjacent to the at least one vertical gate electrode, beginning at a top photodiode depth that is less than the gate depth, extending toward and adjoining the bottom photodiode region in the depth direction, wherein the top photodiode region and a bottom photodiode region are of the same conductive type as the first doped region, wherein each of the first junction depth of the first doped region and the second junction depth of the second doped region, with respect to the front surface, is greater than the top photodiode depth and less than the bottom photodiode depth.

5. The pixel cell according to claim 4, wherein the bottom photodiode region has a cross-sectional width in a direction parallel to the front surface being greater than a cross-sectional width of the top photodiode region and a first junction width of the first doped region.

6. The pixel cell according to claim 5, wherein only a part of the bottom photodiode region of the photodiode is between the first doped region and the backside surface, and the first doped region being distanced from the top photodiode region by a first distance that is greater than a second distance between the first doped region and the bottom photodiode region of the photodiode in a manner that enables excess photoelectrons departing from the bottom photodiode region of the photodiode to the first doped region.

7. The pixel cell according to claim 1, a separation distance between the first doped region and the photodiode region of the photodiode is between 100 nanometers to 300 nanometers.

8. A pixel cell on a semiconductor substrate of a first conductive type, the semiconductor substrate having a front surface and a backside surface, the pixel cell comprising:
   a first photodiode of a second conductive type opposite to the first conductive type, disposed in the semiconductor substrate;
   a second photodiode of the second conductive type adjacent to the first photodiode;
   a floating diffusion region disposed between the first photodiode and the second photodiode, the floating diffusion region comprising a first doped region of the second conductive type and a second doped region of the second conductive type disposed within the first doped region, wherein the first doped region extends from the front surface to have a first junction depth in a first direction perpendicular to the front surface of the semiconductor substrate and the second doped region extends from the front surface to have a second junction depth in the first direction perpendicular to the front surface, the second doped region being surrounded by the first doped region;
   a first transfer gate having a first pair of vertical gate electrodes disposed between the first photodiode and the floating diffusion region along a second direction perpendicular to the first direction, each individual vertical gate electrode of the first pair of vertical gate electrodes extending along the first direction a first gate depth into the semiconductor substrate, the first transfer gate selectively coupling the first photodiode to the floating diffusion region;
   a second transfer gate having a second pair of vertical gate electrodes disposed between the second photodiode and the floating diffusion region along the second direction, each individual vertical gate electrode of the second pair of vertical gate electrodes extending along the first direction a second gate depth into the semiconductor substrate, the second transfer gate selectively coupling the second photodiode to the floating diffusion region; and
   a first buried channel doped region arranged to extend from the first doped region of the floating diffusion region toward the photodiode region of the first photodiode along the second direction through a substrate region between a first vertical transfer gate electrode and a second vertical transfer gate electrode included in the first pair of vertical gate electrodes, the first buried channel doped region having a first buried channel junction depth being less than the first junction depth with respect to the front surface;
   wherein each of the first gate depth and the second gate depth is less than the first junction depth with respect to the front surface;
   wherein the first buried channel doped region is of the second conductive type same as the first doped region of the floating diffusion region;
   wherein both the first doped region and the second doped region are distanced from the photodiode region of the photodiode;
   wherein a first concentration of the first doped region is less than a second concentration of the second doped region.

9. The pixel cell according to claim 8, wherein
the second doped region is disposed in the first doped region and surrounded by the first doped region.

10. The pixel cell according to claim 8, further comprising:
   a source follower transistor having a gate coupled to the floating diffusion region, a source, and a drain, each of the source and the drain having a source-drain junction depth being less than the first junction depth of the first doped region.

11. The pixel cell according to claim 8, further comprising a shallow trench isolation structure disposed between the source follower transistor and the floating diffusion region, the shallow trench isolation structure having an isolation trench depth less than the first junction depth of the first doped region.

12. The pixel cell according to claim 8, wherein each of the first photodiode and the second photodiode further comprises a photodiode region including a top photodiode region and a bottom photodiode region, the top photodiode region beginning at a top photodiode depth that is less than the gate depth, extending toward and adjoining the bottom photodiode region at a bottom photodiode depth that is greater than the gate depth, wherein the first doped region has a part being vertically overlapped with the bottom photodiode region of the photodiode region, wherein the first doped region is laterally spaced from the top photodiode region and vertically spaced from the bottom photodiode region; wherein a vertical distance between the first doped region and the bottom photodiode region is less than a vertical distance between the second doped region and the bottom photodiode region.

13. The pixel cell according to claim 8, further comprising:
   a second buried channel doped region arranged to extend from the first doped region of the floating diffusion region toward the second photodiode along the second direction, the second buried channel doped region having a second buried channel junction depth being less than the first junction depth, and
   a pinning region of the first conductive type disposed between the front surface of the semiconductor substrate and the first buried channel doped region;
   wherein the first doped region electrically coupling to the first photodiode to form a first anti-blooming path between the first photodiode and the first doped region of the floating diffusion region when the first transfer gate is turned off;
   wherein the first buried channel doped region form a first buried channel between a first vertical gate electrode and a second vertical gate electrode of the first pair of vertical gate electrodes to provide a second anti-blooming path between the first photodiode and the floating diffusion region;

wherein the first doped region electrically coupling to the second photodiode to form a third anti-blooming path between the second photodiode and the first doped region of the floating diffusion region when the second transfer gate is turned off;

wherein the second buried channel doped region form a second buried channel between a first and a second vertical gate electrodes of the second pair of vertical gate electrodes to provide a fourth anti-blooming path between the second photodiode and the first doped region.

14. The pixel cell according to claim 8, wherein the first doped region of the floating diffusion region is located between the first transfer gate and the second transfer gate, the first doped region being distanced from each of the first photodiode and the second photodiode.

15. An image sensor including a plurality of pixel cells formed on a semiconductor substrate of a first conductive type, the semiconductor substrate having a front surface and a backside surface, each pixel cell comprising:
 a plurality of photodiodes of a second conductive type opposite to the first conductive type, disposed in the semiconductor substrate;
 a floating diffusion region disposed in the semiconductor substrate;
 a plurality of transfer gates on the front surface of the semiconductor substrate, the plurality of transfer gates selectively coupling the plurality of photodiodes to the floating diffusion region, each of the transfer gates having a planar gate electrode and a pair of vertical gate electrodes, each of the pair of vertical gate electrodes extending from the planar gate electrode, along a first direction perpendicular to the front surface, a gate depth into the semiconductor substrate; and
 a floating diffusion region of the second conductive type disposed in the semiconductor substrate, comprising:
  a first doped region having a first junction depth being greater than the gate depth with respect to the front surface, wherein the first doped region is distanced from each photodiode included in the plurality of photodiodes along a second direction perpendicular to the first direction; and
  a second doped region having a second junction depth, the second doped region disposed in the first doped region and surrounded by the first doped region, the second junction depth being less than the gate depth;
 wherein a first concentration of the first doped region is less than a second concentration of the second doped region.

16. The image sensor according to claim 15, wherein each of the plurality of photodiodes comprises:
 a photodiode region of the second conductive type disposed in the semiconductor substrate, the photodiode region including (i) a bottom photodiode region at a bottom photodiode depth greater than the gate depth, and (ii) a top photodiode region beginning at a top photodiode depth that is less than the gate depth, extending toward and adjoining the bottom photodiode region,
 wherein the top photodiode depth is less than the first junction depth of the floating diffusion region, and the bottom photodiode depth is greater than the first junction depth of the floating diffusion region;
 wherein the first doped region and the second doped region are distanced from the top photodiode region in the second direction and the first doped region is further distanced from the bottom photodiode region by a separation distance ranging between 100 nanometers and 300 nanometers in the first direction such that the first doped region is spaced apart from both the top photodiode region and the bottom photodiode region.

17. The image sensor according to claim 15, wherein each pixel cell further comprises a well region of the first conductive type, being disposed (i) between adjacent photodiodes, and (ii) between the first doped region and the backside surface.

18. The image sensor according to claim 15, wherein each of the plurality of photodiodes further comprises a pinning region of the first conductive type disposed between the front surface and a respective buried channel doped region included in the plurality of buried channel doped regions.

19. The image sensor according to claim 15, wherein both the first doped region and the second doped region are separated from a corresponding photodiode region of each of the plurality of photodiodes, wherein the first doped region is in between the front surface and a part of the corresponding photodiode region of each of the plurality of photodiodes.

* * * * *